(12) United States Patent
Maeda et al.

(10) Patent No.: US 8,530,751 B2
(45) Date of Patent: Sep. 10, 2013

(54) MULTILAYER WIRING SUBSTRATE

(75) Inventors: Shinnosuke Maeda, Nagoya (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 248 days.

(21) Appl. No.: 13/195,290

(22) Filed: Aug. 1, 2011

(65) Prior Publication Data

US 2012/0024582 A1 Feb. 2, 2012

(30) Foreign Application Priority Data

Aug. 2, 2010 (JP) .................................. 2010-173305

(51) Int. Cl.
*H05K 1/00* (2006.01)

(52) U.S. Cl.
USPC ......................................................... 174/258

(58) Field of Classification Search
CPC ........................................................ H05K 1/00
USPC ......................................................... 174/258
See application file for complete search history.

(56) References Cited

U.S. PATENT DOCUMENTS

| | | | |
|---|---|---|---|
| 7,285,856 | B2 | 10/2007 | Ooi et al. |
| 7,696,617 | B2 | 4/2010 | Ooi et al. |
| 8,110,754 | B2 | 2/2012 | Asano |
| 8,129,828 | B2 | 3/2012 | Maeda |
| 2007/0119619 | A1 | 5/2007 | Nakamura et al. |
| 2009/0242262 | A1 | 10/2009 | Asano |
| 2010/0078786 | A1 | 4/2010 | Maeda |
| 2010/0132997 | A1 | 6/2010 | Hando |
| 2010/0155114 | A1 | 6/2010 | Ooi et al. |
| 2010/0155933 | A1 | 6/2010 | Ooi et al. |
| 2011/0000706 | A1 | 1/2011 | Shomura et al. |

FOREIGN PATENT DOCUMENTS

| | | |
|---|---|---|
| JP | 2004-356569 A | 12/2004 |
| JP | 2005-302968 A | 10/2005 |
| JP | 2006-287056 A | 10/2006 |
| JP | 2008-078683 A | 4/2008 |
| JP | 2008-118154 A | 5/2008 |
| JP | 2008-118155 A | 5/2008 |
| JP | 2009-239224 A | 10/2009 |
| JP | 2009-260334 A | 11/2009 |
| JP | 2010-103516 A | 5/2010 |
| JP | 2010-135474 A | 6/2010 |
| JP | 4473935 B1 | 6/2010 |

OTHER PUBLICATIONS

JPO, Office Action for counterpart Japanese Patent Application No. 2010-173305, dispatched May 15, 2012.

*Primary Examiner* — Timothy Thompson
*Assistant Examiner* — Charles Pizzuto
(74) *Attorney, Agent, or Firm* — Stites & Harbison PLLC; Jeffrey A. Haeberlin (57) ABSTRACT

A multilayer wiring substrate includes a laminate structure in which resin insulation layers and conductor layers are alternately laminated. The resin insulation layers include first-type resin insulation layers, and second-type resin insulation layers, each of which contains an inorganic material in a larger amount and is smaller in thermal expansion coefficient as compared with first-type resin insulation layers. On a cross section of the laminate structure taken along a thickness direction thereof, the ratio of a total thickness of the second-type resin insulation layers located in an area A2 to a thickness corresponding to the area A2 is greater than the ratio of a total thickness of the second-type resin insulation layers located in an area A1 to a thickness corresponding to the area A1. The laminate structure is warped such that the laminate structure is convex toward the side where the second main face is present.

20 Claims, 6 Drawing Sheets

SEPARATION

MULTILAYER WIRING SUBSTRATE

CROSS REFERENCE TO RELATED APPLICATIONS

The present application claims priority from Japanese Patent Application No. 2010-173305, which was filed on Aug. 2, 2010, the disclosure of which is herein incorporated by reference in its entirety.

BACKGROUND OF THE INVENTION

1. Field of the Invention

The present invention relates to a multilayer wiring substrate having a laminate structure in which a plurality of resin insulation layers and a plurality of conductor layers are laminated alternately in multilayer arrangement, and not having a so-called substrate core in a final product, the substrate core carrying build-up layers successively formed on opposite surfaces thereof.

2. Description of Related Art

In association with recent increasing tendency toward higher operation speed and higher functionality of IC chips used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate or the like) formed by impregnating reinforcement fiber with resin. Through utilization of rigidity of the substrate core, resin insulation layers and conductor layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of IC chips, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, there has been proposed a multilayer wiring substrate configured in the form of a core-less wiring substrate having no substrate core. The core-less wiring substrate does not use a substrate core, which is relatively thick, thereby reducing the overall wiring length. Thus, the transmission loss of high-frequency signals is lowered, whereby an IC chip can be operated at high speed.

Incidentally, an IC chip is formed from a semiconductor material whose thermal expansion coefficient is about 2.0 ppm/° C. to 5.0 ppm/° C. (e.g., silicon or the like). Meanwhile, a multilayer wiring substrate is formed from a resin material or the like whose overall thermal expansion coefficient is about 30 ppm/° C. Therefore, the conventional multilayer wiring substrate is greater in thermal expansion coefficient than the IC chip, which brings about the following problem. When solder used for connection between the IC chip and the multilayer wiring substrate is cooled, due to the influence of thermal stress stemming from the difference in thermal expansion coefficient between the material of the IC chip and the material of the multilayer wiring substrate, cracks may be generated in connection portions, and open failure or the like may occur. That is, in the case where the multilayer wiring substrate as described above is configured, there arises a problem in that high yield and reliability cannot be realized.

In order to solve such a problem, a technique of placing an interposer between the multilayer wiring substrate and the IC chip has been proposed (see, for example, Patent Document 1). When this configuration is employed, the difference in thermal expansion coefficient between the multilayer wiring substrate and the IC chip decreases, and cracks become less likely to be produced in connection portions between the multilayer wiring substrate and the IC chip. Therefore, yield increases, and reliability is enhanced.

RELATED ART DOCUMENTS

Patent Documents

Patent Document 1 is Japanese Patent Application Laid-open (kokai) No. 2008-118155 (FIG. 1, etc.).

BRIEF SUMMARY OF THE INVENTION

However, whereas only a portion of the upper surface of the multilayer wiring substrate is used as a connection surface for connection with an IC chip, the entire back surface of the multilayer wiring substrate is used as a connection surface for connection with a motherboard. Therefore, thermal stress acting on connection portions between the multilayer wiring substrate and the motherboard becomes greater than that acting on connection portions between the multilayer wiring substrate and the IC chip. In addition, an underfill material is charged in the space between the multilayer wiring substrate and the IC chip, or an interposer as described above is placed between the multilayer wiring substrate and the IC chip. Therefore, the thermal stress acting on connection portions between the multilayer wiring substrate and the IC chip is relaxed by the underfill material or the interposer. Because of the above-described factors, the connection portions between the multilayer wiring substrate and the motherboard receive the influence of the thermal stress stemming from the difference in thermal expansion coefficient to a greater degree as compared with the connection portions between the multilayer wiring substrate and the IC chip.

The present invention has been accomplished in view of the above problems, and an object of the invention is to provide a multilayer wiring substrate whose reliability is enhanced through prevention of generation of cracks in connection portions between the multilayer wiring substrate, and an IC chip or a motherboard.

A means (Means 1) for solving the above problems is a multilayer wiring substrate having a laminate structure in which a plurality of resin insulation layers, and a plurality of conductor layers are laminated alternately in multilayer arrangement, a plurality of IC chip connection terminals to which an IC chip is to be connected being disposed on a first main surface side of the laminate structure where a first main surface thereof is present, a plurality of motherboard connection terminals to which a motherboard is to be connected being disposed on a second main surface side of the laminate structure where a second main surface thereof is present, the plurality of conductor layers being interconnected by means of via conductors formed in the plurality of resin insulation layers such that their diameters increase toward the first main surface or the second main surface, the multilayer wiring substrate being characterized in that the plurality of resin insulation layers include first-type resin insulation layers formed of a build-up material mainly (primarily) formed of a resin insulation material; and a second-type resin insulation layer(s) (i.e., one or more second-type resin insulation layers) formed of a build-up material which comprises (contains) an inorganic material in an amount greater than the amount of the inorganic material in the build-up material used to form the first-type resin insulation layers and whose thermal expansion coefficient is smaller than that of the first-type resin insulation layers; on a cross section of the laminate structure taken along a thickness direction thereof, a ratio of a total thickness of the second-type resin insulation layer(s) located in a first area between an imaginary line (center line) and the second main face (surface) (or a line contained therein) to a thickness corresponding to the first area is greater than a ratio of a total thickness of the second-type resin insulation layer(s) located in an area between the imaginary line (center line) and the first main face (surface) (or a line contained therein) to a thickness corresponding to the second area, the imaginary line (center line) being set at a location where a distance between the imaginary line (center line) and the first main face (surface) becomes equal to a distance between the imaginary line (center line) and the second main face (surface); and the laminate structure is warped such that the laminate structure is convex toward (i.e., convex away from) the second main surface side (the side where the second main face is present).

Another means (Means 2) for solving the above problems is a multilayer wiring substrate having a laminate structure in which a plurality of resin insulation layers, and a plurality of conductor layers are laminated alternately in multilayer arrangement, a plurality of IC chip connection terminals to which an IC chip are to be connected being disposed on a first main surface side of the laminate structure where a first main surface thereof is present, a plurality of motherboard connection terminals to which a motherboard is to be connected being disposed on a second main surface side of the laminate structure where a second main surface thereof is present, the plurality of conductor layers being interconnected by means of via conductors formed in the plurality of resin insulation layers such that their diameters increase toward the first main surface or the second main surface, the multilayer wiring substrate being characterized in that the plurality of resin insulation layers include first-type resin insulation layers formed of a build-up material mainly (primarily) formed of a resin insulation material; and a second-type resin insulation layer(s) (i.e., one or more second-type resin insulation layers) formed of a build-up material which contains an inorganic material in an amount greater than the amount of the inorganic material in the build-up material used to form the first-type resin insulation layers and whose thermal expansion coefficient is smaller than that of the first-type resin insulation layers; the second-type resin insulation layers are disposed asymmetrically on opposite sides of a reference resin insulation layer located at a center of the laminate structure with respect to a thickness direction thereof; the second-type resin insulation layer(s) are provided in a greater number in an area located on one side of the reference resin insulation layer toward the second main face (surface), as compared with those provided in an area located on the other side of the reference resin insulation layer toward the first main face (surface); and the laminate structure is warped such that the laminate structure is convex toward (i.e., convex away from) the second main surface side (the side where the second main face is present).

According to the inventions described in the above-described Means 1 and 2, the laminate structure is constituted by the first-type resin insulation layers, and the second-type resin insulation layer(s) formed of a build-up material which is smaller in thermal expansion coefficient than the first-type resin insulation layers. Therefore, as compared with the case where all the resin insulation layers are the first-type resin insulation layers, the thermal expansion coefficient of the laminate structure decreases. As a result, in the case where the thermal expansion coefficient of the laminate structure is greater than those of the IC chip and the motherboard, the difference in thermal expansion coefficient between the laminate structure and the IC chip and the difference in thermal expansion coefficient between the laminate structure and the motherboard become smaller, as compared with the case where all the resin insulation layers are the first-type resin insulation layers. As a result, the influence of thermal stress stemming from the difference in thermal expansion coefficient is mitigated. Therefore, it is possible to prevent generation of cracks in the connection portions between the laminate structure and the IC chip and the connection portions between the laminate structure and the motherboard.

According to the invention described in Means 1, the ratio of a total thickness of the second-type resin insulation layers located in an area between the above-mentioned imaginary line and a line contained in the second main face to a thickness corresponding to that area is greater than the ratio of a total thickness of the second-type resin insulation layers located in an area between the above-mentioned imaginary line and a line contained in the first main face to a thickness corresponding to that area. Further, according to the invention described in Means 2, the second-type resin insulation layers are provided in a greater number in an area located on one side of the reference resin insulation layer toward the second main face, as compared with those provided in an area located on the other side of the reference resin insulation layer toward the first main face. As a result, in both the inventions described in Means 1 and 2, the thermal expansion coefficient of the laminate structure on the side toward the second main face becomes smaller than the thermal expansion coefficient of the laminate structure on the side toward the first main face. Therefore, in the case where the thermal expansion coefficient of the laminate structure is greater than the thermal expansion coefficient of the motherboard, the thermal expansion coefficient of the laminate structure on the side toward the second main face can be made closer to the thermal expansion coefficient of the motherboard. Since the difference in thermal expansion coefficient between the laminate structure and the motherboard decreases further, the influence of thermal stress attributable to the difference in thermal expansion coefficient can be mitigated further. As a result, it becomes possible to reliably prevent generation of cracks at a portion which is typically connected to a motherboard through a large area and at which cracks are likely to be generated due to absence of an underfill material or the like (the connection portion between the laminate structure and the motherboard). Therefore, yield is increased, and the reliability of the multilayer wiring substrate is enhanced.

In addition, in the inventions described in Means 1 and 2, the laminate structure warped to be convex toward the side where the second main face is present is intentionally fabricated. Therefore, in the case where the thermal expansion coefficient of the laminate structure is greater than the thermal expansion coefficient of the IC chip, when the IC chip is connected to the IC chip connection terminals of the laminate structure, the laminate structure warps to the side where the first main face exists, due to influence of thermal stress stemming from the difference in thermal expansion coefficient between the material of the IC chip and the material of the laminate structure. As a result, the warpage of the laminate structure which is convex toward the second main face side is corrected. Accordingly, there can be manufactured a multilayer wiring substrate which is free from warpage after the IC chip is connected thereto.

The term "IC chip" used herein refers to an element mainly used as a microprocessor of a computer or the like. The "thermal expansion coefficient" means that in a direction (XY direction) perpendicular to a thickness direction (Z direction) and is a value obtained by measurement in a temperature range of 0° C. to 100° C. inclusive with a TMA (thermomechanical analyzer) (this applies to the following description). TMA, or thermomechanical analysis, is specified in, for example, JPCA-BU01.

Preferred examples of the build-up material used to form the first-type resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin.

Meanwhile, the second-type resin insulation layers are formed of a build-up material whose thermal expansion coefficient is smaller than that of the first-type resin insulation layers. Preferred examples of the build-up material used to form the second-type resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin.

Furthermore, the build-up material used to form the second-type resin insulation layers contains an inorganic material in an amount greater than the amount of the inorganic material contained in the build-up material used to form the first-type resin insulation layers. Preferred examples of the inorganic material include ceramic materials, metallic materials, and glass materials. Examples of the ceramic materials include low-temperature firing materials such as alumina, glass ceramic, and crystallized glass; aluminum nitride; silicon carbide; and silicon nitride. Examples of the metallic materials include iron, gold, silver, copper, copper alloy, iron-nickel alloy, silicon, and gallium arsenide. Notably, in the case where the inorganic material is a metallic material, static electricity and electromagnetic radiation from a noise source can be shielded by the resin insulation layer. Further, preferably, the second-type resin insulation layers contain at least one of inorganic filler and inorganic fiber cloth as an inorganic material. In the case where the inorganic material is inorganic fiber cloth, high rigidity can be imparted by the resin insulation layers themselves (therefore, by the laminate structure). In the case where the inorganic material is inorganic filler, even when the second-type resin insulation layers and the first-type resin insulation layers contain the inorganic material, the resin insulation layers can be readily machined. Examples of the inorganic filler include ceramic filler, metallic filler, and glass filler. Examples of the inorganic fiber cloth include glass cloth (woven glass cloth or unwoven glass cloth), metallic fibers, and paper.

Notably, the thickness of the first-type resin insulation layers and the thickness of the second-type resin insulation layers may differ from each other or be equal to each other. In the case where the thickness of the first-type resin insulation layers and the thickness of the second-type resin insulation layers differ from each other, the strength of each resin insulation layer can be readily adjusted in accordance with, for example, the content of the inorganic material. Meanwhile, in the where the thickness of the first-type resin insulation layers and the thickness of the second-type resin insulation layers are equal to each other, via conductors can be formed under the same machining condition for both the first-type resin insulation layers and the second-type resin insulation layers.

Preferably, at least one of an outermost resin insulation layer on the first main face side and an outermost resin insulation layer on the second main face side is the first-type resin insulation layer. That is, the second-type resin insulation layer is desirably a resin insulation layer located inside the outermost resin insulation layer. If the outermost resin insulation layer is the second-type resin insulation layer, in the case where the second-type resin insulation layer contains inorganic fiber cloth, fibers may be exposed from the first main face or the second main face. Therefore, this configuration is not preferred for the case where flat IC chip connection terminals are formed on the first main face or flat motherboard connection terminals are formed on the second main face. Furthermore, in the case where via holes for via conductors are formed in the outermost resin insulation layer, the output of a laser must be increased so as to enable a laser beam to pass through the inorganic fiber cloth contained in the resin insulation layer. Increasing the laser output is unfavorable to formation of via holes having a desired cross sectional shape. In addition, since fibers are exposed from the wall surfaces of the via holes, the following problem occurs. When the material of the via conductors is charged into the via holes so as to form the via conductors, there arise a possibility that the material of the via conductors cannot be charged into the via holes completely. In this case, since it becomes difficult to establish electrical communication between the plurality of conductor layers by means of via conductors, the reliability of the multilayer wiring substrate drops.

The conductor layers, the IC chip connection terminals, and the motherboard connection terminals are mainly made of copper, and are formed by a known process, such as a subtractive process, a semi-additive process, or a full-additive process.

Notably, each of the via conductors formed in the plurality of resin insulation layers may be shaped such its diameter increases in the direction from the second main face side toward the first main face side. Alternatively, each of the via conductors formed in the plurality of resin insulation layers may be shaped such its diameter increases in the direction from the first main face side toward the second main face side. When such a shape is employed, a coreless wiring substrate having no substrate core can be manufactured relatively easily.

Furthermore, a reinforcement member may be joined to the first main face, the reinforcement member assuming a frame-like shape, as a whole, as viewed from above so as to expose the plurality of IC chip connection terminals. In this case, warpage of the laminate structure is restrained by the reinforcement member, and cracks become less likely to be generated in connection portions between the laminate structure and the IC chip. Therefore, yield is increased, and reliability is enhanced.

Preferably, the reinforcement member is stiffer than the resin material used to form the laminate structure. For example, the Young's modulus of the reinforcement member is desirably greater than that of the resin material used to form the laminate structure. The reason is as follows. In the case where high rigidity is imparted to the reinforcement member itself, high rigidity can be imparted to the laminate structure by means of joining the reinforcement member thereto, whereby the laminate structure becomes stronger against externally applied stress. Further, in the case where the rigidity of the reinforcement member is high, a sufficiently high rigidity can be imparted to the laminate structure even when the thickness of the reinforcement member is decreased. Thus, the reinforcement member does not hinder reduction of the overall thickness of the laminate structure.

Preferred examples of the material of the reinforcement member include resin materials and metallic materials. Examples of the metallic materials include copper, iron, aluminum, and stainless steel. Further, no particular limitation is imposed on the method of joining the reinforcement member to the first main face of the laminate structure, and a known method suitable for the nature of the material of the reinforcement member, the shape of the reinforcement member, etc. may be employed.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An embodiment in which a multilayer wiring substrate of the present invention is embodied will next be described in detail with reference to the drawings.

Figure 1:
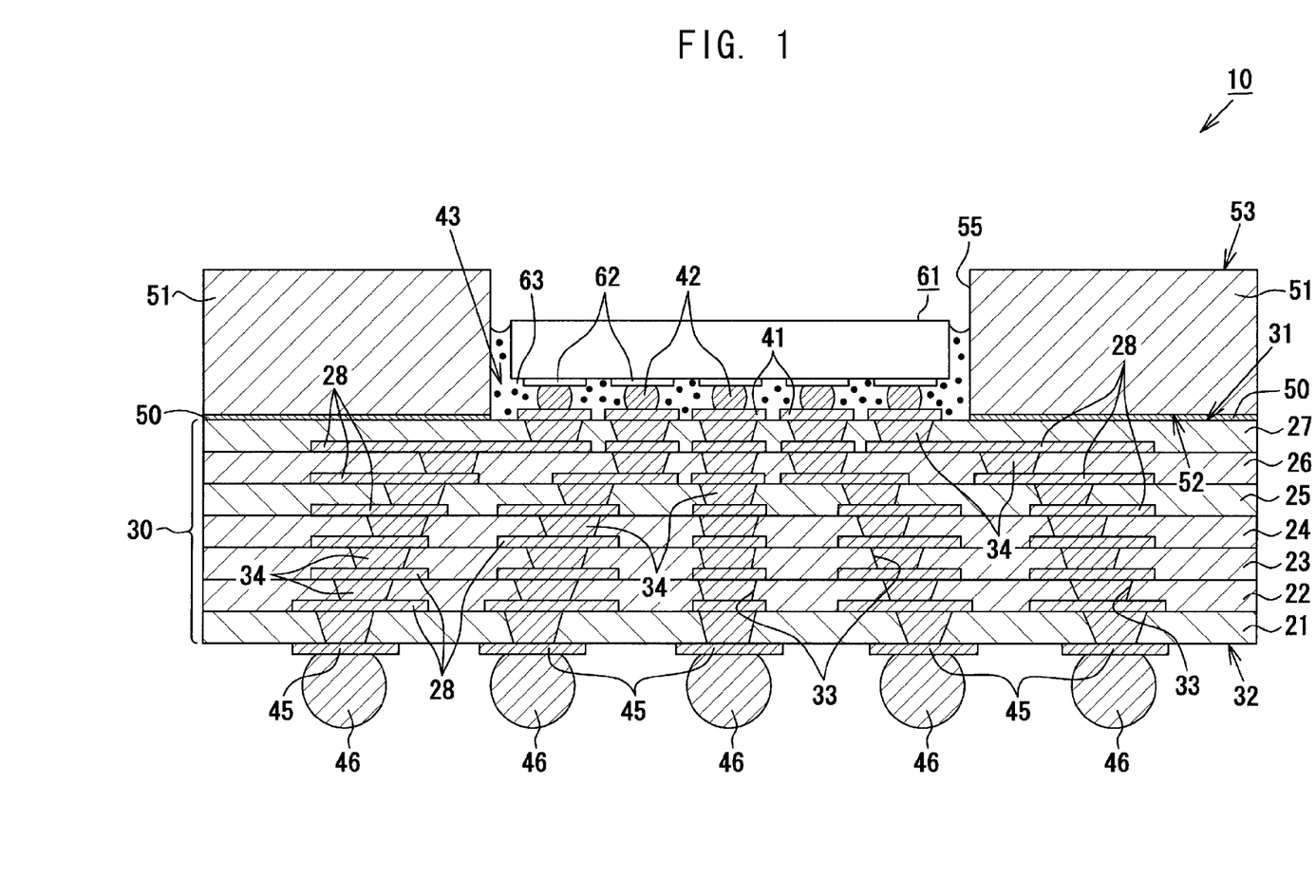
FIG. 1 is a sectional view schematically showing the structure of a multilayer wiring substrate according to an embodiment of the present invention.
Figure 2:
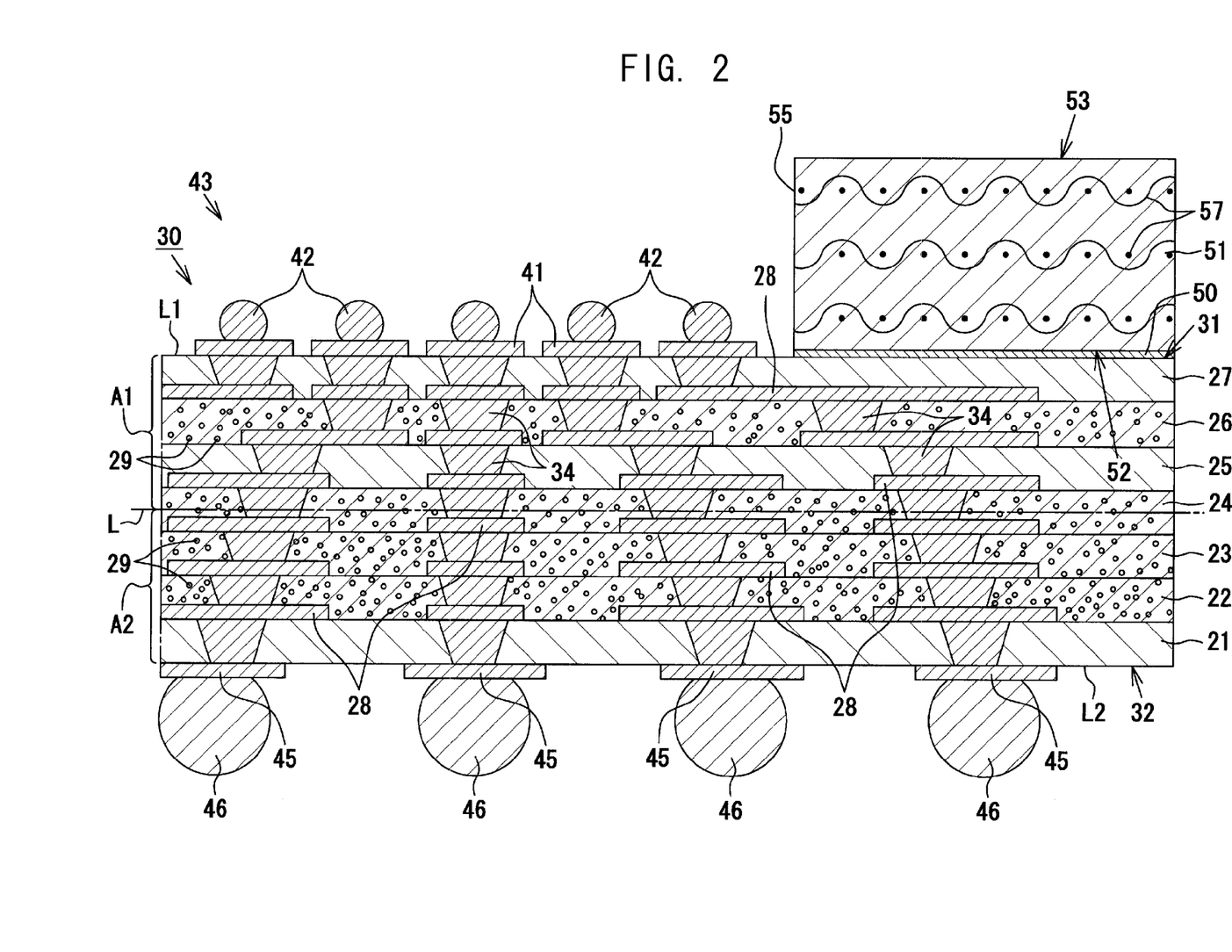
FIG. 2 is a sectional view of a main portion of the multilayer wiring substrate.

As shown in FIGS. 1 and 2, an exemplary multilayer wiring substrate 10 is a core-less wiring substrate 10 which does not include a substrate core, and includes a wiring laminate portion 30 (laminate structure) having a first main face 31 (first main surface) (upper surface in FIG. 1) and a second main face 32 (second main surface) (lower surface in FIG. 1). The exemplary wiring laminate portion 30 of the present embodiment assumes a generally rectangular shape as viewed from above, and has a size of 50.0 mm (longitudinal direction)× 50.0 mm (lateral direction)×0.28 mm (thickness).

The exemplary wiring laminate portion 30 has a multilayer structure in which seven resin insulation layers 21, 22, 23, 24, 25, 26, 27 and six conductor layers 28 are alternately laminated. Each of the resin insulation layers 21 to 27 is formed of a build-up material made primarily of a hardened resin insulation material that is not photocurable; specifically, a hardened thermosetting epoxy resin. Of the resin insulation layers 21 to 27, the first, fifth, and seventh resin insulation layers 21, 25, 27 serve as first-type resin insulation layers, and the second, third, fourth, and sixth resin insulation layers 22, 23, 24, 26 serve as second-type resin insulation layers. Therefore, the outermost resin insulation layer on the side toward the first main face 31 is a first-type resin insulation layer (the first-type resin insulation layer 27), and the outermost resin insulation layer on the side toward the second main face 32 is also the first-type resin insulation layer (the first-type resin insulation layer 21). Furthermore, the first-type resin insulation layers 21, 25, 27 and the second-type resin insulation layers 22, 23, 26 are disposed asymmetrically on opposite sides of the second-type resin insulation layer 24. Moreover, the resin insulation layers (the second-type resin insulation layers 22, 23) disposed in an area A2 on the side of the second-type resin insulation layer 24 toward the second main face 32 are greater in number than the resin insulation layer (the second-type resin insulation layer 26) disposed in an area A1 on the side of the second-type resin insulation layer 24 toward the first main face 31. That is, the second-type resin insulation layer 24 is a reference resin insulation layer located at the center of the wiring laminate portion 30 with respect to the thickness direction thereof. Notably, preferably, the thicknesses of the first-type resin insulation layers 21, 25, 27 and the second-type resin insulation layers 22, 23, 24, 26 fall within a range of 25 μm to 45 μm inclusive. In the present embodiment, the thicknesses of these layers are set to 40 μm. Therefore, the thickness of the first-type resin insulation layers 21, 25, 27 and the thickness of the second-type resin insulation layers 22, 23, 24, 26 are equal to each other.

Notably, in the present embodiment, whereas the second-type resin insulation layers 22, 23, 24, 26 contain a glass filler 29 (see FIG. 2) as an inorganic material (inorganic filler), the first-type resin insulation layers 21, 25, 27 do not contain the glass filler 29. That is, the second-type resin insulation layers 22, 23, 24, 26 contain the glass filler 29 in a greater amount than do the first-type resin insulation layers 21, 25, 27. Moreover, the second-type resin insulation layers 22, 23, 24, 26 are formed of a build-up material whose thermal expansion coefficient is smaller than that of the build-up material used to form the first-type resin insulation layers 21, 25, 27. Specifically, the build-up material used to form the first-type resin insulation layers 21, 25, 27 has a thermal expansion coefficient of 40 ppm/° C. after being hardened, and the build-up material used to form the second-type resin insulation layers 22, 23, 24, 26 has a thermal expansion coefficient of 20 ppm/° C. after being hardened. The thermal expansion coefficient of the glass filler 29 is 3 ppm/° C., and the thermal expansion coefficient of the conductor layers 28 is 17 ppm/° C. The overall thermal expansion coefficient of the wiring laminate portion 30 is 22 ppm/° C. Notably, the thermal expansion coefficient is an average of values measured in a temperature range of 0° C. to the glass transition temperature (Tg).

As shown in FIG. 2, as viewed on a cross section of the wiring laminate portion 30 taken along the thickness direction thereof, the ratio of the total thickness of the second-type resin insulation layers 22 to 24 located in an area A2 between an imaginary line L and a line L2 to a thickness corresponding to the area A2 is greater than the ratio of the total thickness of the second-type resin insulation layers 24, 26 located in an area A1 between the imaginary line L and a line L1 to a thickness corresponding to the area A1. Notably, the imaginary line L is set at a location where the distance between the imaginary line L and the first main face 31 and the distance between the imaginary line L and the second main face 32 become equal to each other. In other words, the imaginary line L is a center line set at the center of the second-type resin insulation layer 24 with respect to the thickness direction. The line L1 is a line contained in the first main face 31, and the line L2 is a line contained in the second main face 32. Notably, in the present embodiment, the thickness corresponding to the area A1 is equal to the sum (140 μm) of the total thickness of the resin insulation layers 25 to 27 (120 μm (=40 μm×3)) and the thickness of one half of the second-type resin insulation layer 24 (20 μm (=40 μm/2)). Furthermore, the total thickness of the second-type resin insulation layers 24, 26 located in the area A1 is the sum (60 μm) of the thickness of the entire second-type resin insulation layer 26 (40 μm) and the thickness of one half of the second-type resin insulation layer 24 (20 μm). Therefore, the ratio of the total thickness of the second-type resin insulation layers 24, 26 to the thickness corresponding to the area A1 is about 43% (=(60 μm/140 μm)×100). Meanwhile, the thickness corresponding to the area A2 is equal to the sum (140 μm) of the total thickness of the resin insulation layers 21 to 23 (120 μm (=40 μm×3)) and the thickness of one half of the second-type resin insulation layer 24 (20 μm), and is equal to the thickness corresponding to the area A1. Furthermore, the total thickness of the second-type resin insulation layers 22 to 24 located in the area A2 is the sum (100 μm) of the total thickness of the second-type resin insulation layers 22, 23 (80 μm (=40 μm×2)) and the thickness of one half of the second-type resin insulation layer 24 (20 μm). Therefore, the ratio of the total thickness of the second-type resin insulation layers 22 to 24 to a thickness corresponding to the area A2 is about 71% (=(100 μm/140 μm)×100), and is greater than the ratio of the total thickness of the second-type resin insulation layer 24, 26 to the thickness corresponding to the area A1. Therefore, the thermal expansion coefficient of a portion (area A2) of the wiring laminate portion 30 located on the side toward the second main face 32 becomes 18 ppm/° C., and the thermal expansion coefficient of a portion (area A1) of the wiring laminate portion 30 located on the side toward the first main face 31 becomes 28 ppm/° C., whereby the thermal expansion coefficient in the area A2 becomes smaller than that in the area A1.

As shown in FIGS. 1 and 2, via holes 33 and via conductors 34 are provided in the resin insulation layers 21 to 27. Each of the via holes 33 assumes the form of a circular truncated cone, and is formed by drilling the resin insulation layers 21 to 27 by use of a YAG laser or a carbon dioxide gas laser. The via conductors 34 are shaped such that their diameters increase in the same direction (in FIG. 1, in the direction from the second main face 32 toward the first main face 31). The via conductors 34 electrically interconnect the conductor layers 28 formed on the resin insulation layers 21 to 26, IC chip connection terminals 41 formed on the first-type resin insulation layer 27, and motherboard connection terminals 45 formed on the first-type resin insulation layer 21.

The plurality of motherboard connection terminals 45 for BGA (ball grid array), to which a motherboard is to be connected, are disposed in an array on the second main face 32 of the wiring laminate portion 30. A plurality of second-main-face-side solder bumps 46 for motherboard connection are disposed on the surfaces of the motherboard connection terminals 45. The wiring laminate portion 30 is mounted on an unillustrated motherboard via the second-main-face-side solder bumps 46. Notably, the thermal expansion coefficient of the motherboard is smaller than the thermal expansion coefficient of the wiring laminate portion 30 (22 ppm/° C.). Specifically, the thermal expansion coefficient of the motherboard is set to about 15 ppm/° C. That is, in the present embodiment, the difference in thermal expansion coefficient between the motherboard and the wiring laminate portion 30 is about 7.0 ppm/° C. Furthermore, the difference in thermal expansion coefficient between the motherboard and the area A2 of the wiring laminate portion 30 is about 3.0 ppm/° C.

Meanwhile, as shown in FIGS. 1 and 2, the plurality of IC chip connection terminals 41, to which an IC chip 61 is to be connected, are disposed on the first main face 31 of the wiring laminate portion 30. The IC chip connection terminals 41 are disposed in an array in a chip mounting area 43 provided at the center of the substrate. A plurality of first-main-face-side solder bumps 42 are disposed on the surfaces of the IC chip connection terminals 41. The first-main-face-side solder bumps 42 are electrically connected to surface connection terminals 62 of the IC chip 61. Notably, the IC chip 61 assumes the form of a rectangular flat plate, has a size of 15.0 mm (longitudinal direction)×15.0 mm (lateral direction)×0.8 mm (thickness), and is formed of silicon whose thermal expansion coefficient is 4.2 ppm/° C. That is, the thermal expansion coefficient of the IC chip 61 is smaller than the thermal expansion coefficient of the wiring laminate portion 30 (22 ppm/° C.), and the difference in thermal expansion coefficient between the IC chip 61 and the wiring laminate portion 30 is 17.8 ppm/° C.

Moreover, a stiffener 51, which is a reinforcement member, is joined to the first main face 31 of the wiring laminate portion 30. The stiffener 51 has an outer dimension of 50.0 mm (longitudinal direction)×50.0 mm (lateral direction)×1.0 mm (thickness), and assumes the form of a rectangular frame, as a whole, as viewed from above. Notably, the stiffener 51 is formed of a composite material composed of a resin material (in the present embodiment, epoxy resin) and glass cloth 57 placed within the resin material (see FIG. 2). The stiffener 51 is stiffer than the resin material (in the present embodiment, epoxy resin) used to constitute the wiring laminate portion 30. Specifically, the Young's modulus of the stiffener 51 is greater than that of the wiring laminate portion 30 (about 8 GPa), and is set to about 30 GPa. Moreover, the thermal expansion coefficient of the stiffener 51 is smaller than the thermal expansion coefficient of the wiring laminate portion (22 ppm/° C.). Specifically, the thermal expansion coefficient of the stiffener 51 is set to about 16 ppm/° C. That is, in the present embodiment, the difference in thermal expansion coefficient between the stiffener 51 and the wiring laminate portion 30 is about 6.0 ppm/° C.

As shown in FIGS. 1 and 2, the stiffener 51 has a contact surface 52 and a non-contact surface 53 located on the side opposite the contact surface 52. The contact surface 52 can be brought into surface contact with a peripheral portion of the first main face 31 (that is, the area of the first main face 31 excluding the chip mounting area 43). Furthermore, the stiffener 51 has an opening 55 which extends through the stiffener 51 and assumes a rectangular shape as viewed from above. The opening 55 is open at a central portion of the contact surface 52 and at a central portion of the non-contact surface 53. The opening 55 exposes the IC chip connection terminals 41 and the first main-face-side solder bumps 42. Specifically, the opening 55 is a hole which has a generally square shape, has a size of 20 mm (longitudinal direction)×20 mm (lateral direction), and has four rounded corners having a radius of 1.5 mm.

The contact surface 52 of the stiffener 51 is surface-joined to a peripheral portion of the first main face 31 via an adhesive 50. Notably, the adhesive 50 used in the present embodiment is an epoxy adhesive whose thermal expansion coefficient is about 20 ppm/° C. An underfill material 63 formed of epoxy resin is charged into the opening 55. Specifically, the underfill material 63 is charged into the clearance between the IC chip 61 and the wiring laminate portion 30, and the clearance between the IC chip 61 and the stiffener 51. In the present embodiment, the thermal expansion coefficient of the underfill material 63 is about 25 ppm/° C.

Next, a method of manufacturing the multilayer wiring substrate 10 will be described.

First, a support substrate (a glass epoxy substrate or the like) having sufficient strength is prepared. On the support substrate, the resin insulation layers 21 to 27 and the conductor layers 28 are alternately built up, thereby forming the wiring laminate portion 30.

Figure 3:
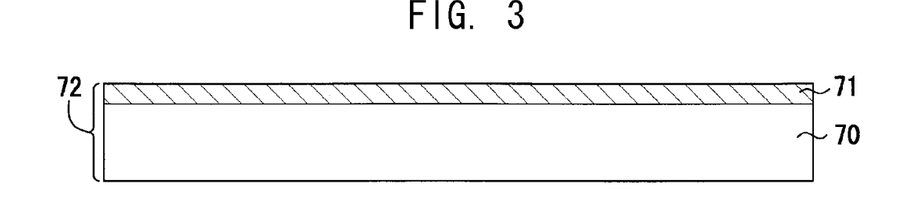
FIG. 3 is an explanatory view showing a method of manufacturing the multilayer wiring substrate.
Figure 4:
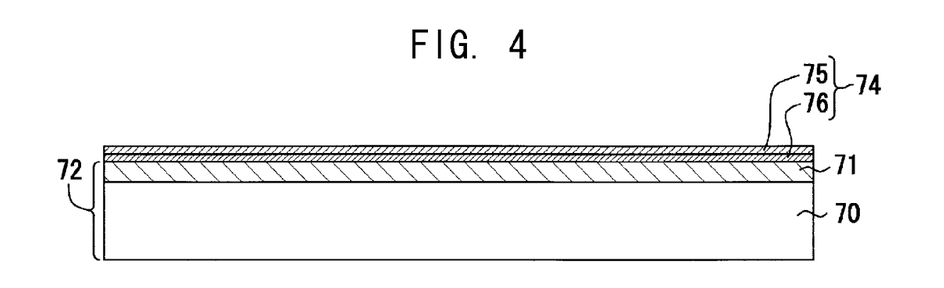
FIG. 4 is an explanatory view showing the method of manufacturing the multilayer wiring substrate.

More specifically, as shown in FIG. 3, a sheet-like electrically insulative resin base material made of epoxy resin and serving as a ground resin insulation layer 71 is attached onto a support substrate 70, thereby yielding a base material 72 consisting of the support substrate 70 and the ground resin insulation layer 71. Then, as shown in FIG. 4, a metal laminate sheet 74 is disposed on the upper surface of the ground resin insulation layer 71 of the base material 72. Through disposition of the metal laminate sheet 74 on the ground resin insulation layer 71, there is ensured such adhesion that, in the subsequent fabrication process, the metal laminate sheet 74 is not separated from the ground resin insulation layer 71. The metal laminate sheet 74 is configured such that two copper foils 75 and 76 are separably in close contact with each other. Specifically, the copper foils 75 and 76 are laminated together with metal plating (e.g., chromium plating, nickel plating, titanium plating, or composite plating thereof) intervening therebetween, thereby forming the metal laminate sheet 74.

Figure 5:
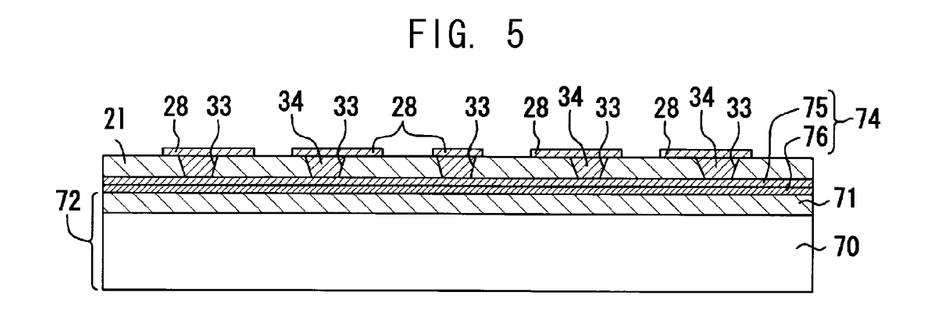
FIG. 5 is an explanatory view showing the method of manufacturing the multilayer wiring substrate.

A sheet-like electrically insulative resin base material is disposed on the metal laminate sheet 74, and is pressed and heated in vacuum by use of a vacuum pressure bonding hot press (not shown). Thus, the electrically insulative resin base material is hardened, whereby the first-type resin insulation layer 21 (see FIG. 5) is formed. Subsequently, the via holes 33 (see FIG. 5) are formed in the first-type resin insulation layer 21 at predetermined positions by means of performing laser beam machining by use of, for example, an excimer laser, a UV laser, or a $CO_2$ laser. Next, desmear processing for removing smears from inside the via holes 33 is performed. After that, electroless copper plating and copper electroplating are performed by a known process, thereby forming the via conductors 34 (see FIG. 5) in the via holes 33. Further, etching is performed by a known process (e.g., semi-additive process), thereby forming the conductor layer 28 in a predetermined pattern on the first-type resin insulation layer 21 (see FIG. 5).

Figure 6:
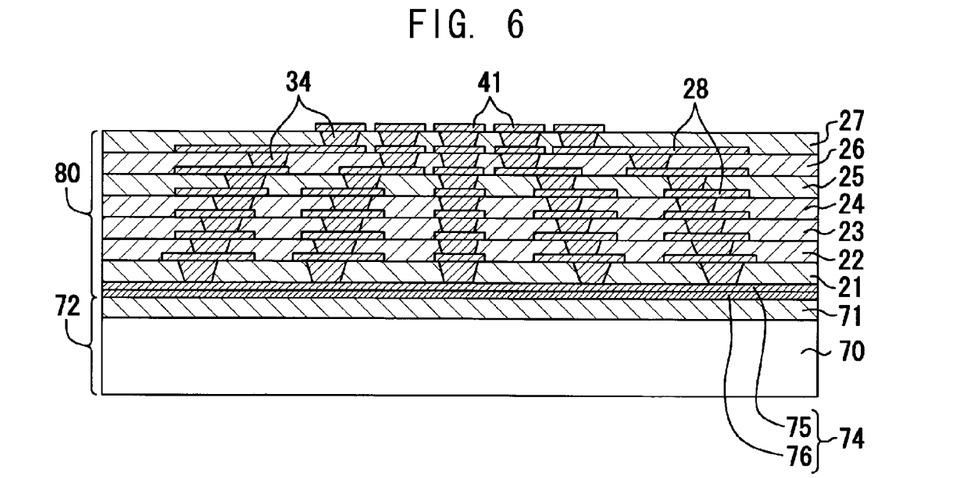
FIG. 6 is an explanatory view showing the method of manufacturing the multilayer wiring substrate.

Also, the resin insulation layers 22 to 27, the conductor layers 28, and the IC chip connection terminals 41 are formed and laminated on the first-type resin insulation layer 21 by processes similar to those used to form the above-mentioned first-type resin insulation layer 21 and conductor layers 28. In the present embodiment, the via holes 33 are formed under the same laser irradiation condition and the via conductors 34 are formed under the same plating condition for both the first-type resin insulation layers 21, 25, 27 and the second-type resin insulation layer 22, 23, 24, 26. Through the above-described manufacturing steps, there is formed a laminate 80 in which the metal laminate sheet 74, the resin insulation layers 21 to 27, the conductor layer 28, and the IC chip connection terminals 41 are laminated on the base material 72 (see FIG. 6). Notably, a portion of the wiring laminate 80 which is located above the metal laminate sheet 74 will become the wiring laminate portion 30 of the multilayer wiring substrate 10.

Figure 7:
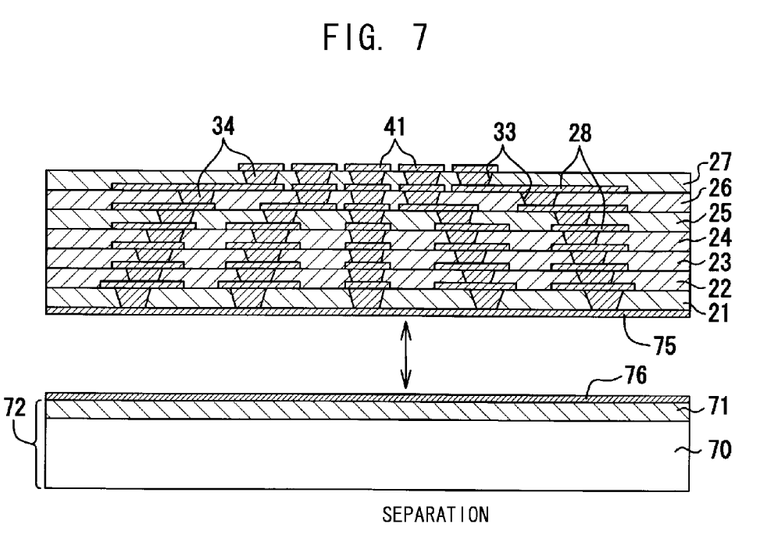
FIG. 7 is an explanatory view showing the method of manufacturing the multilayer wiring substrate.

Next, the base material 72 is removed from the wiring laminate 80, whereby the copper foil 75 is exposed. Specifically, the wiring laminate portion 30 and the base material 72 are separated from each other at the interface between the two copper foils 75 and 76 of the metal laminate sheet 74 (see FIG. 7).

Figure 8:
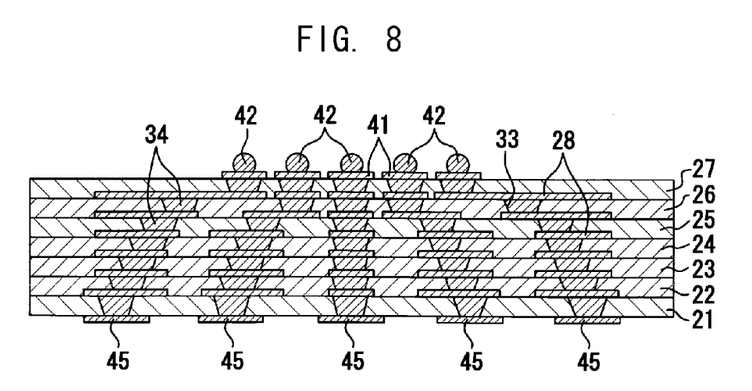
FIG. 8 is an explanatory view showing the method of manufacturing the multilayer wiring substrate.

Subsequently, as shown in FIG. 8, the copper foil 75 present on the lower surface of the wiring laminate portion 30 (the first-type resin insulation layer 21) is patterned through etching, whereby the motherboard connection terminals 45 are formed on the lower surface of the first-type resin insulation layer 21. Next, the first-main-face-side solder bumps 42 for IC chip connection are formed on the plurality of IC chip connection terminals 41 formed on the first-type resin insulation layer 27. Specifically, after solder balls are placed on the IC chip connection terminals 41 by use of an unillustrated solder-ball placing apparatus, the solder balls are heated to a predetermined temperature for reflow, whereby the first-main-face-side solder bumps 42 are formed on the IC chip connection terminals 41. Similarly, the second-main-face-side solder bumps 46 are formed on the plurality of motherboard connection terminals 45 formed on the first-type resin insulation layer 21. As a result, the multilayer wiring substrate 10 (wiring laminate portion 30) is completed. Notably, at this point in time, the wiring laminate portion 30 has warpage such that it is convex toward (or away from) the side where the second main face 32 is present (see FIG. 9).

Also, the stiffener 51 is manufactured and prepared in advance. Notably, the opening 55 is formed in advance at a predetermined position by means of performing hole-forming work for the stiffener 51 by use of a counter boring tool, a mechanical drill, a punching machine, a YAG laser, a $CO_2$ laser, or the like.

Figure 9:
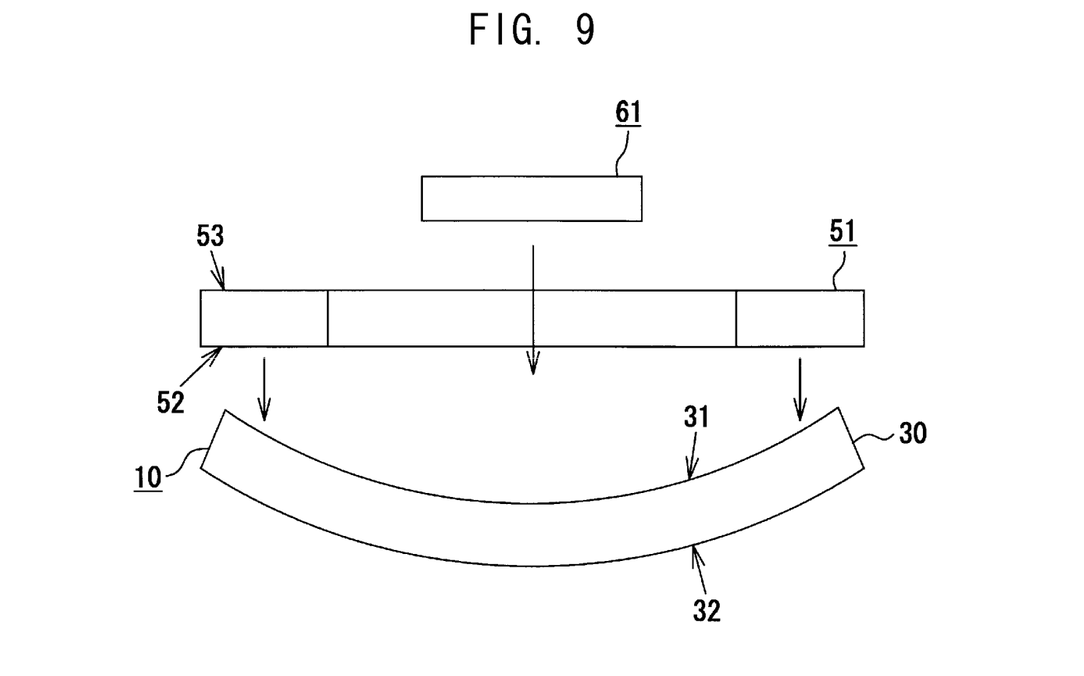
FIG. 9 is an explanatory view showing the method of manufacturing the multilayer wiring substrate.

Next, in a state in which the multilayer wiring substrate 10 and the stiffener 51 are positioned, the stiffener 51 is joined to the first main face 31 of the wiring laminate portion 30 (see FIG. 9). Specifically, first, the multilayer wiring substrate 10 is supported by an unillustrated support member. Next, in a state in which the adhesive 50 is applied to the contact surface 52 of the stiffener 51, the stiffener 51 is disposed on the first main face 31 so that the contact surface 52 is brought into contact with the first main face 31. In this state, heating (curing) is performed at, for example, about 150° C. so as to harden the adhesive 50. When the heated adhesive 50 is cooled to room temperature, the stiffener 51 is fixedly joined to the first main face 31 via the adhesive 50 (see FIG. 2). Notably, at the time of cooling after the joining of the stiffener 51, the wiring laminate portion 30 warps toward the first main face 31 side.

After that, the IC chip 61 is mounted on the wiring laminate portion 30 in the chip mounting area 43 (see FIG. 1). At that time, the surface contact terminals 62 of the IC chip 61 and the first-main-face-side solder bumps 42 on the wiring laminate portion 30 are aligned. Subsequently, the first-main-face-side solder bumps 42 are heated for reflow, whereby the surface contact terminals 62 and the first-main-face-side solder bumps 42 are joined, and the IC chip 61 is mounted on the wiring laminate portion 30. Notably, at the time of cooling after the joining of the IC chip 61, the wiring laminate portion 30 warps further toward the first main face 31 side. As a result, the warpage of the wiring laminate portion 30 such that it is convex toward the side where the second main face 32 is present is corrected. After that, a thermosetting resin, which serves as the underfill material 63, is charged into the opening 55, and is hardened through heating.

Accordingly, the present embodiment achieves the following effects.

(1) According to the multilayer wiring substrate 10 of the present embodiment, the wiring laminate portion 30 is constituted by the first-type resin insulation layers 21, 25, 27, and the second-type resin insulation layers 22, 23, 24, 26 formed of a build-up material which is smaller in thermal expansion coefficient than the first-type resin insulation layers 21, 25, 27. Therefore, as compared with the case where all the resin insulation layers 21 to 27 are the first-type resin insulation layers, the thermal expansion coefficient of the wiring laminate portion 30 decreases. As a result, in the multilayer wiring substrate of the present embodiment, in which the thermal expansion coefficient of the wiring laminate portion 30 is greater than those of the IC chip 61 and the motherboard, the difference in thermal expansion coefficient between the wiring laminate portion 30 and the IC chip 61 and the difference in thermal expansion coefficient between the wiring laminate portion 30 and the motherboard become smaller, as compared with the case where all the resin insulation layers 21 to 27 are the first-type resin insulation layers. As a result, the influence of thermal stress stemming from the difference in thermal expansion coefficient is mitigated. Therefore, it is possible to prevent generation of cracks in the connection portions between the wiring laminate portion 30 and the IC chip 61 and the connection portions between the wiring laminate portion 30 and the motherboard.

Moreover, according to the present embodiment, the number of the second-type resin insulation layers disposed in the area A2 located on the side of the second-type resin insulation layer 24 toward the second main face 32 is greater than the number of the second-type resin insulation layers disposed in the area A1 located on the side of the second-type resin insulation layer 24 toward the first main face 31. Thus, the ratio of the total thickness of the second-type resin insulation layers 22 to 24 to the thickness corresponding to the area A2 is greater than the ratio of the total thickness of the second-type resin insulation layers 24, 26 to the thickness corresponding to the area A1. As a result, the thermal expansion coefficient of the wiring laminate portion 30 on the side toward the second main face (in the area A2) becomes smaller than the thermal expansion coefficient of the wiring laminate portion 30 on the side toward the first main face 31 (in the area A1). Therefore, in the present embodiment, in which the thermal expansion coefficient of the wiring laminate portion 30 is greater than the thermal expansion coefficient of the motherboard, the thermal expansion coefficient in the area A2 can be made closer to the thermal expansion coefficient of the motherboard. Since the difference in thermal expansion coefficient between the wiring laminate portion 30 and the motherboard decreases further, the influence of thermal stress attributable to the difference in thermal expansion coefficient can be mitigated further. As a result, it becomes possible to reliably prevent generation of cracks at a portion which is typically connected to a motherboard through a large area and at which cracks are likely to be generated due to absence of an underfill material or the like (the connection portion between the wiring laminate portion 30 and the motherboard). Therefore, yield is increased, and the reliability of the multilayer wiring substrate 10 is enhanced.

(2) In the present embodiment, the wiring laminate portion 30 is intentionally fabricated to be convex toward the side where the second main face 32 (see FIG. 9). Therefore, in the present embodiment, in which the thermal expansion coefficient of the wiring laminate portion 30 is greater than the thermal expansion coefficient of the IC chip 61, when the IC chip 61 is connected to the IC chip connection terminals 41, the wiring laminate portion 30 warps to the side where the first main face 31 exists, due to influence of thermal stress stemming from the difference in thermal expansion coefficient between the material of the IC chip 61 and the material of the wiring laminate portion 30. As a result, the warpage of the wiring laminate portion 30 which is convex toward the second main face 32 side is corrected. Accordingly, there can be manufactured a multilayer wiring substrate 10 which is free from warpage after the IC chip 61 is connected thereto.

Notably, the present embodiment can be changed as follows.

Figure 10:
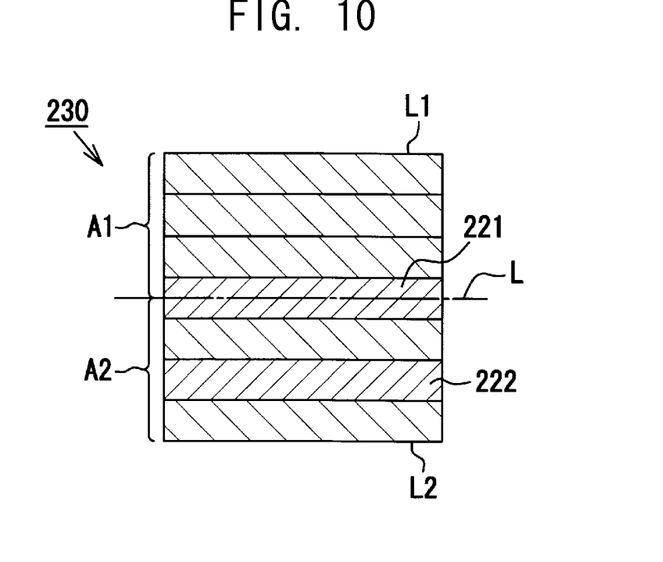
FIG. 10 is a sectional view schematically showing a wiring laminate portion in another embodiment.
Figure 11:
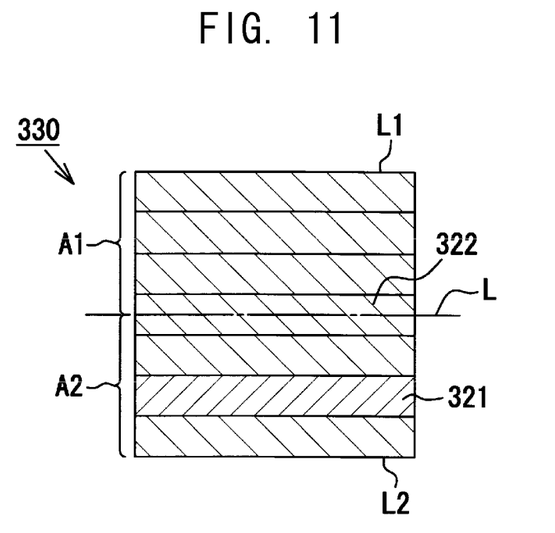
FIG. 11 is a sectional view schematically showing a wiring laminate portion in another embodiment.

In the wiring laminate portion 30 of the above-described embodiment, the entire second-type resin insulation layer 26 and the upper half of the second-type resin insulation layer 24 are disposed in the area A1, and the entire second-type resin insulation layers 22, 23 and the lower half of the second-type resin insulation layer 24 are disposed in the area A2, whereby the ratio of the total thickness of the second-type resin insulation layers 22 to 24 to the thickness corresponding to the area A2 is rendered greater than the ratio of the total thickness of the second-type resin insulation layers 24, 26 to the thickness corresponding to the area A1. However, as shown in FIG. 10, the multilayer wiring substrate of the present invention may have a wiring laminate portion 230 in which only the upper half of a second-type resin insulation layer 221 is disposed in the area A1, and the entirety of a second-type resin insulation layer 222 and the lower half of the second-type resin insulation layer 221 are disposed in the area A2, whereby the ratio of the total thickness of the second-type resin insulation layers 221 and 222 to the thickness corresponding to the area A2 is rendered greater than the ratio of the total thickness of the second-type resin insulation layer 221 to the thickness corresponding to the area A1. Alternately, as shown in FIG. 11, the multilayer wiring substrate of the present invention may have a wiring laminate portion 330 in which a second-type resin insulation layer 321 is disposed in the area A2, and no second-type resin insulation layer is disposed in the area A1, whereby the ratio of the total thickness of the second-type resin insulation layer 321 to the thickness corresponding to the area A2 is rendered greater than the ratio of the total thickness of the second-type resin insulation layer to the thickness corresponding to the area A1. Notably, in the wiring laminate portion 330, instead of the second-type resin insulation layer, a first-type resin insulation layer 322 is used as a reference resin insulation layer.

Figure 12:
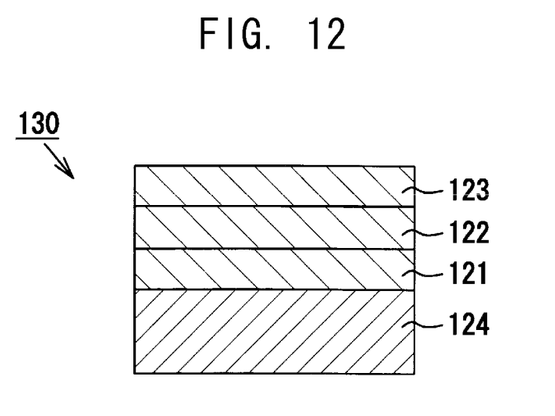
FIG. 12 is a sectional view schematically showing a wiring laminate portion in another embodiment.

In the wiring laminate portion 30 of the present embodiment, the thickness of the first-type resin insulation layers 21, 25, 27 and the thickness of the second-type resin insulation layers 22, 23, 24, 26 are equal to each other. However, as shown in FIG. 12, the multilayer wiring substrate of the present invention may have a wiring laminate portion 130 in which the thickness of first-type resin insulation layers 121, 122, 123 and the thickness of a second-type resin insulation layer 124 differ from each other. Notably, preferably, the thickness of the second-type resin insulation layer 124 is not less than 1.2 times and not greater than 2.0 times the thickness of the first-type resin insulation layer 121 to 123. In the wiring laminate portion 130 shown in FIG. 12, each of the thicknesses of the first-type resin insulation layer 121 to 123 is set to 40 μm, and the thickness of the second-type resin insulation layer 124 is set to 60 μm.

In the above-described embodiment, whereas the second-type resin insulation layers 22, 23, 24, 26 contain the glass filler 29 as an inorganic material, the first-type resin insulation layers 21, 25, 27 do not contain any inorganic material. However, the embodiment may be modified such that each of the first-type resin insulation layers 21, 25, 27 contains an inorganic material in a certain amount, and each of the second-type resin insulation layer 22, 23, 24, 26 contains the inorganic material in an amount greater than the certain amount.

The second-type resin insulation layers 22, 23, 24, 26 of the above-described embodiment contain the glass filler 29 as an inorganic material. However, the second-type resin insulation layers 22, 23, 24, 26 may contain glass cloth (inorganic fiber cloth) instead of glass filler. In this case, since the overall thermal expansion coefficient of the second-type resin insulation layers 22, 23, 24, 26 greatly decreases, the thermal expansion coefficient of the build-up material used to form the second-type resin insulation layer 22, 23, 24, 26 is not required to decrease greatly. Notably, in the case where the second-type resin insulation layers 22, 23, 24, 26 contain glass cloth, in order to secure the functions of the build-up material (providing close contact with other resin insulation layers and providing insulation between the conductor layers 28), a resin insulation material of a certain amount must be secured. Therefore, the second-type resin insulation layers 22, 23, 24, 26 become thicker by an amount corresponding to the thickness of the glass cloth (about 15 μm).

In the above-described embodiment, the thermal expansion coefficient of the stiffener 51 (about 16 ppm/° C.) is smaller than the thermal expansion coefficient of the wiring laminate portion 30 (22 ppm/° C.), and the number of the second-type resin insulation layers disposed in the area A2 is greater than the number of the second-type resin insulation layers disposed in the area A1. However, in the case where the thermal expansion coefficient of the stiffener 51 is greater than the thermal expansion coefficient of the wiring laminate portion 30, the number of the second-type resin insulation layers disposed in the area A1 may be increased. Notably, the stiffener 51 may be omitted.

In the above-described embodiment, the via conductors 34 formed in the resin insulation layer 21 to 27 are shaped such that their diameters increase in the direction from the second main face 32 toward the first main face 31. However, the shape of the via conductors 34 is not limited thereto. The via conductors 34 formed in the resin insulation layer 21 to 27 are only required to be shaped such that their diameters increase in the same direction. For example, the via conductors 34 formed in the resin insulation layer 21 to 27 may be shaped such that their diameters increase in the direction from the first main face 31 toward the second main face 32.

In the above-described embodiment, at least one of the upper surface of the first-type resin insulation layer 27 and the lower surface of the first-type resin insulation layer 21 may be covered with solder resist such that the solder resist covers substantially the entirety of the respective surfaces. Notably, openings for exposing the IC chip connection terminals 41 are formed, at predetermined positions, in the solder resist covering the upper surface of the first-type resin insulation layer 27, and openings for exposing the motherboard connection terminals 45 are formed, at predetermined positions, in the solder resist covering the lower surface of the first-type resin insulation layer 21.

The wiring laminate portion 30 of the above-described embodiment is formed by laminating seven resin insulation layers 21 to 27. However, the wiring laminate portion 30 may be formed by six or less resin insulation layers, or 8 or more resin insulation layers.

Next, technical ideas that the embodiments described above implement are enumerated below.

(1) In the multilayer wiring substrate according to the above-described Means 1 or 2, the thickness of the first-type resin insulation layers and the thickness of the second-type resin insulation layers differ from each other.

(2) In the multilayer wiring substrate according to the technical idea (1), the thickness of the second-type resin insulation layers is not less than 1.2 times and not greater than 2.0 times the thickness of the first-type resin insulation layers.

(3) In the multilayer wiring substrate according to the above-described Means 1 or 2, the thickness of the first-type resin insulation layers and the thickness of the second-type resin insulation layers are equal to each other.

(4) In the multilayer wiring substrate according to the above-described Means 1 or 2, the thickness of the first-type resin insulation layers and the thickness of the second-type resin insulation layers fall within a range of 25 μm to 45 μm inclusive.

(5) In the multilayer wiring substrate according to the above-described Means 1 or 2, a reinforcement member which assumes the form of a frame, as a whole, as viewed from above, is joined to the first-main-face-side, an opening for exposing the plurality of IC chip connection terminals is formed in the reinforcement member to extend therethrough, and an underfill material is charged into the opening.

DESCRIPTION OF REFERENCE NUMERALS

10: multilayer wiring substrate
21, 25, 27, 121, 122, 123: first-type resin insulation layer (resin insulation layer)
322: first-type resin insulation layer (resin insulation layer; reference resin insulation layer)
22, 23, 26, 124, 222, 321: second-type resin insulation layer (resin insulation layer)
24, 221: second-type resin insulation layer (resin insulation layer; reference resin insulation layer)
28: conductor layer
29: glass filler (inorganic material; inorganic filler)
30, 130, 230, 330: wiring laminate portion (laminate structure)
31: first main face
32: second main face
34: via conductor
41: IC chip connection terminal
45: motherboard connection terminal
51: stiffener (reinforcement member)
61: IC chip
A1: area between an imaginary line and a line contained in the first main face (area located on the first main face side of the reference resin insulation layer)
A2: area between the imaginary line and a line contained in the second main face (area located on the second main face side of the reference resin insulation layer)
L: imaginary line
L1: line contained in the first main face
L2: line contained in the second main face

What is claimed is:

1. A multilayer wiring substrate comprising a laminate structure in which a plurality of resin insulation layers, and a plurality of conductor layers are laminated alternately in multilayer arrangement, a plurality of IC chip connection terminals to which an IC chip is to be connected being disposed on a first main surface side of the laminate structure where a first main surface thereof is present, a plurality of motherboard connection terminals to which a motherboard is to be connected being disposed on a second main surface side of the laminate structure where a second main surface thereof is present, the plurality of conductor layers being interconnected by means of via conductors formed in the plurality of resin insulation layers such that their diameters increase toward the first main surface or the second main surface, wherein:

the plurality of resin insulation layers include first-type resin insulation layers formed of a build-up material primarily formed of a resin insulation material, and one or more second-type resin insulation layer formed of a build-up material which comprises an inorganic material in an amount greater than the amount of the inorganic material in the build-up material used to form the first-type resin insulation layers and whose thermal expansion coefficient is smaller than that of the first-type resin insulation layers;

on a cross section of the laminate structure taken along a thickness direction thereof, a ratio of a total thickness of the one or more second-type resin insulation layers located in a first area between a center line and the second main surface to a thickness corresponding to the first area is greater than a ratio of a total thickness of the one or more second-type resin insulation layers located in a second area between the center line and the first main surface to a thickness corresponding to the second area, the center line being set at a location where a distance between the center line and the first main surface equals a distance between the center line and the second main surface; and     the laminate structure is warped such that the laminate structure is convex toward the second main surface side.

2. A multilayer wiring substrate comprising a laminate structure in which a plurality of resin insulation layers, and a plurality of conductor layers are laminated alternately in multilayer arrangement, a plurality of IC chip connection terminals to which an IC chip are to be connected being disposed on a first main surface side of the laminate structure where a first main surface thereof is present, a plurality of motherboard connection terminals to which a motherboard is to be connected being disposed on a second main surface side of the laminate structure where a second main surface thereof is present, the plurality of conductor layers being interconnected by means of via conductors formed in the plurality of resin insulation layers such that their diameters increase toward the first main surface or the second main surface, wherein:

the plurality of resin insulation layers include first-type resin insulation layers formed of a build-up material primarily formed of a resin insulation material; and one or more second-type resin insulation layers formed of a build-up material which contains an inorganic material in an amount greater than the amount of the inorganic material in the build-up material used to form the first-type resin insulation layers and whose thermal expansion coefficient is smaller than that of the first-type resin insulation layers;

the second-type resin insulation layers are disposed asymmetrically on opposite sides of a reference resin insulation layer located at a center of the laminate structure with respect to a thickness direction thereof;

the one or more second-type resin insulation layers are provided in a greater number in an area located on one side of the reference resin insulation layer toward the second main surface, as compared with the one or more second-type resin insulation layers provided in an area located on the other side of the reference resin insulation layer toward the first main surface; and     the laminate structure is warped such that the laminate structure is convex toward the second main surface side.

3. A multilayer wiring substrate according to claim 1, wherein the one or more second-type resin insulation layers include at least one of inorganic filler and inorganic fiber cloth as the inorganic material.

4. A multilayer wiring substrate according to claim 1, wherein at least one of an outermost resin insulation layer located on the first main surface side and an outermost resin insulation layer located on the second main surface side is the first-type resin insulation layer.

5. A multilayer wiring substrate according to claim 1, wherein a reinforcement member is joined to the first main surface, the reinforcement member assuming a frame-like shape so as to expose the plurality of IC chip connection terminals.

6. A multilayer wiring substrate according to claim 5, wherein an opening for exposing the plurality of IC chip connection terminals is formed in the reinforcement member and extending therethrough, and an underfill material is charged into the opening.

7. A multilayer wiring substrate according to claim 1, wherein the thickness of the first-type resin insulation layers and the thickness of the one or more second-type resin insulation layers differ from each other.

8. A multilayer wiring substrate according to claim 7, wherein the thickness of the one or more second-type resin insulation layers is not less than 1.2 times and not greater than 2.0 times the thickness of the first-type resin insulation layers.

9. A multilayer wiring substrate according to claim 1, wherein the thickness of the first-type resin insulation layers and the thickness of the one or more second-type resin insulation layers are equal to each other.

10. A multilayer wiring substrate according to claim 1, wherein the thickness of the first-type resin insulation layers and the thickness of the one or more second-type resin insulation layers fall within a range of 25 μm to 45 μm inclusive.

11. A multilayer wiring substrate according to claim 1, wherein each of the via conductors formed in the plurality of resin insulation layers is shaped such that its diameter increases in a direction from the second main surface toward the first main surface, or is shaped such that its diameter increases in a direction from the first main surface toward the second main surface.

12. A multilayer wiring substrate according to claim 2, wherein the one or more second-type resin insulation layers include at least one of inorganic filler and inorganic fiber cloth as the inorganic material.

13. A multilayer wiring substrate according to claim 2, wherein at least one of an outermost resin insulation layer located on the first main surface side and an outermost resin insulation layer located on the second main surface side is the first-type resin insulation layer.

14. A multilayer wiring substrate according to claim 2, wherein a reinforcement member is joined to the first main surface, the reinforcement member assuming a frame-like shape so as to expose the plurality of IC chip connection terminals.

15. A multilayer wiring substrate according to claim 14, wherein an opening for exposing the plurality of IC chip connection terminals is formed in the reinforcement member and extending therethrough, and an underfill material is charged into the opening.

16. A multilayer wiring substrate according to claim 2, wherein a thickness of the first-type resin insulation layers and a thickness of the one or more second-type resin insulation layers differ from each other.

17. A multilayer wiring substrate according to claim 16, wherein the thickness of the one or more second-type resin insulation layers is not less than 1.2 times and not greater than 2.0 times the thickness of the first-type resin insulation layers.

18. A multilayer wiring substrate according to claim 2, wherein a thickness of the first-type resin insulation layers and a thickness of the one or more second-type resin insulation layers are equal to each other.

19. A multilayer wiring substrate according to claim 2, wherein a thickness of the first-type resin insulation layers and a thickness of the one or more second-type resin insulation layers fall within a range of 25 μm to 45 μm inclusive.

20. A multilayer wiring substrate according to claim 2, wherein each of the via conductors formed in the plurality of resin insulation layers is shaped such that its diameter increases in a direction from the second main surface toward the first main surface, or is shaped such that its diameter increases in a direction from the first main surface toward the second main surface.

\* \* \* \* \*